(12) United States Patent
Abou-Khalil et al.

(10) Patent No.: US 11,315,825 B2
(45) Date of Patent: Apr. 26, 2022

(54) SEMICONDUCTOR STRUCTURES INCLUDING STACKED DEPLETED AND HIGH RESISTIVITY REGIONS

(71) Applicant: GLOBALFOUNDRIES U.S. Inc., Santa Clara, CA (US)

(72) Inventors: Michel J. Abou-Khalil, Essex Junction, VT (US); Aaron Vallett, Jericho, VT (US); Steven M. Shank, Jericho, VT (US); Bojidha Babu, South Burlington, VT (US); John J. Ellis-Monaghan, Grand Isle, VT (US); Anthony K. Stamper, Williston, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 100 days.

(21) Appl. No.: 16/553,737

(22) Filed: Aug. 28, 2019

(65) Prior Publication Data
US 2021/0066118 A1    Mar. 4, 2021

(51) Int. Cl.
| | | |
|---|---|---|
| *H01L 21/762* | (2006.01) | |
| *H01L 29/06* | (2006.01) | |
| *H01L 21/265* | (2006.01) | |
| *H01L 21/324* | (2006.01) | |

(52) U.S. Cl.
CPC .. *H01L 21/76283* (2013.01); *H01L 21/26533* (2013.01); *H01L 21/324* (2013.01); *H01L 29/0649* (2013.01)

(58) Field of Classification Search
CPC ............. H01L 21/76283; H01L 21/322; H01L 21/76224; H01L 21/26513; H01L 21/26506; H01L 21/26533; H01L 21/324; H01L 29/1083; H01L 29/04; H01L 29/78; H01L 29/0649
See application file for complete search history.

(56) References Cited

U.S. PATENT DOCUMENTS

| | | | | |
|---|---|---|---|---|
| 2,884,607 | A * | 4/1959 | Uhlir, Jr. | ........... H01L 29/66 333/258 |
| 5,723,896 | A * | 3/1998 | Yee | ........... H01L 21/26506 257/499 |
| 7,795,679 | B2 | 9/2010 | Cannon et al. | |
| 7,989,889 | B1 * | 8/2011 | Kerr | ........... H03F 3/213 257/339 |
| 8,324,031 | B2 | 12/2012 | Tan et al. | |
| 10,192,779 | B1 | 1/2019 | Shank et al. | |
| 2004/0262693 | A1 * | 12/2004 | Ohsawa | ........... H01L 27/1203 257/369 |
| 2007/0205444 | A1 * | 9/2007 | Luo | ........... H01L 29/045 257/288 |

(Continued)

*Primary Examiner* — Vongsavanh Sengdara
(74) *Attorney, Agent, or Firm* — Thompson Hine LLP; Francois Pagette

(57) ABSTRACT

Structures including electrical isolation and methods associated with forming such structures. A semiconductor layer has a top surface, a polycrystalline region, and a single-crystal region between the polycrystalline region and the top surface. An isolation band is located beneath the single-crystal region. The isolation band contains a first concentration of an n-type dopant and a second concentration of a p-type dopant, and a net difference between the first concentration and the second concentration is within a range of about five percent to about fifteen percent.

19 Claims, 3 Drawing Sheets

(56) References Cited

U.S. PATENT DOCUMENTS

| | | | |
|---|---|---|---|
| 2011/0180876 A1* | 7/2011 | Laine | H03K 17/08122 |
| | | | 257/355 |
| 2011/0260233 A1* | 10/2011 | Nguyen | H01L 21/823462 |
| | | | 257/316 |
| 2012/0168863 A1* | 7/2012 | Zhu | H01L 27/1203 |
| | | | 257/347 |

* cited by examiner

SEMICONDUCTOR STRUCTURES INCLUDING STACKED DEPLETED AND HIGH RESISTIVITY REGIONS

BACKGROUND

The present invention relates to semiconductor device fabrication and integrated circuits and, more specifically, to structures including electrical isolation and methods associated with forming such structures.

Device structures, such as radiofrequency switches, are susceptible to high capacitance and body-to-body leakage when formed using a bulk semiconductor wafer. A measure that may be taken to reduce the susceptibility is to replace the bulk wafer with a silicon-on-insulator wafer in which a buried insulator layer is arranged between the body furnishing an active region of the device structure and the body of the substrate beneath the buried insulator layer. Another measure that may be taken to reduce the susceptibility is to provide triple well isolation that surrounds the active region of the device structure.

Although such measures have proven suitable for their intended purpose, structures with improved electrical isolation and methods of forming such structures are needed.

SUMMARY

In an embodiment of the invention, a structure includes a semiconductor layer having a top surface, a polycrystalline region, and a single-crystal region between the polycrystalline region and the top surface. An isolation band is located beneath the single-crystal region. The isolation band contains a first concentration of an n-type dopant and a second concentration of a p-type dopant, and a net difference between the first concentration and the second concentration is within a range of about five percent to about fifteen percent.

In an embodiment of the invention, a method includes forming a polycrystalline region and a single-crystal region in a semiconductor layer in which the single-crystal region is positioned between the polycrystalline region and a top surface of the semiconductor layer. The method further includes forming an isolation band beneath the single-crystal region. The isolation band contains a first concentration of an n-type dopant and a second concentration of a p-type dopant, and a net difference between the first concentration and the second concentration is within a range of about five percent to about fifteen percent.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
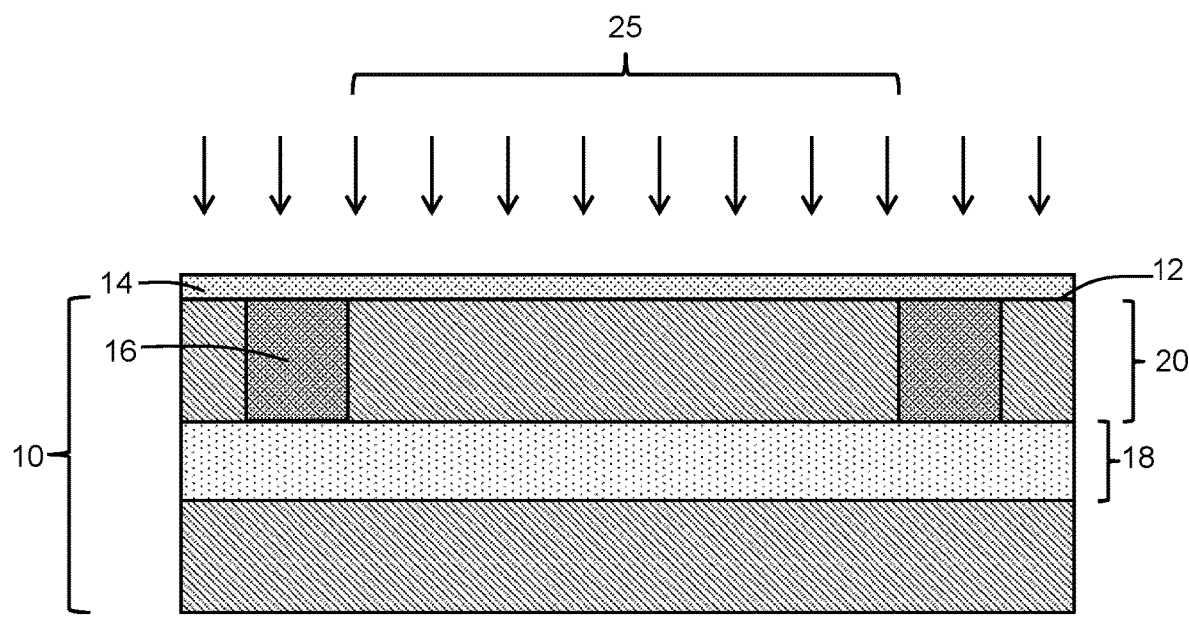
FIGS. 1-4 are cross-sectional views of a structure at successive fabrication stages of a processing method in accordance with embodiments of the invention.

With reference to FIG. 1 and in accordance with embodiments of the invention, a semiconductor layer 10 is provided that is composed of a monocrystalline or single-crystal semiconductor material, such as single-crystal silicon. The semiconductor layer 10 may be a bulk wafer composed of single-crystal semiconductor material (e.g., single-crystal silicon), and the bulk wafer may be either a high-resistivity bulk wafer or a low-resistivity bulk wafer. Generally, a high-resistivity bulk wafer may contain silicon having a resistivity greater than 100 ohm-cm and a low-resistivity bulk silicon wafer may contain silicon having a resistivity less than 100 ohm-cm. A dielectric layer 14 may be formed on the top surface 12 of the semiconductor layer 10. The dielectric layer 14 may be composed of a dielectric material, such as silicon dioxide, deposited on the top surface 12 by chemical vapor deposition or grown from the top surface 12 by thermal oxidation.

Shallow trench isolation regions 16 are formed in trenches that extend from the top surface 12 of the semiconductor layer 10 to a shallow depth into the semiconductor layer 10. The shallow trench isolation regions 16 may be composed of a dielectric material, such as silicon dioxide, deposited by chemical vapor deposition into trenches etched in the semiconductor layer 10 by a masked etching process, polished, and deglazed. The shallow trench isolation regions 16 surround an active region 25 of the semiconductor layer 10 in which a device may be subsequently formed.

Regions 18, 20 of modified semiconductor material are formed by ion implantation in the semiconductor layer 10 and are characterized by a depth profile within the semiconductor layer 10. The region 18 is located over a given depth range in the depth profile beneath the top surface 12 of the semiconductor layer 10, and the region 20 is located over a given depth range in the depth profile between the region 18 and the top surface 12 of the semiconductor layer 10. The semiconductor layer 10 may be undamaged and remain single crystal at depths located beyond the region 18. In an embodiment, a single ion implantation may be performed to provide the regions 18, 20. The active region 25 is a portion of the region 20 of modified semiconductor material, and the active region 25 is positioned between the region 18 of modified semiconductor material and the top surface 12.

The region 18 includes an inert gas species introduced by the implanted ions and damage to the single-crystal semiconductor material of the semiconductor layer 10 caused by the implantation. The distribution of the implanted inert gas species in the region 18 may have a peak concentration occurring near a projected range of the ions, and the distribution of damage in the region 18 may exhibit a peak damage also occurring near the projected range of the ions. The region 20 includes implantation damage that may be significantly less than the damage in region 18, and a concentration of the inert gas species that may be significantly less than the concentration of the inert gas species in the region 18, or that may be negligible.

The ion implantation performed to form the regions 18, 20 introduces energetic ions, as indicated diagrammatically by the single-headed arrows, with ion trajectories that penetrate through the dielectric layer 14 into the semiconductor layer 10 and that stop in the semiconductor material of the semiconductor layer 10. The energetic ions, as they penetrate into the semiconductor layer 10, lose energy via scattering events with atomic nuclei and electrons in the semiconductor material of the semiconductor layer 10. Energy lost in nuclear collisions, which dominates at low kinetic energies after energy loss, displaces target atoms of the semiconductor layer 10 from their original lattice sites, which damages the crystal lattice structure of the semiconductor layer 10 and generates point defects. The ions stop in the semiconductor layer 10, and primarily within the bounds of region 18, after the kinetic energy is fully dissipated by the energy loss.

The ions may be generated from a suitable source gas and implanted into the semiconductor layer 10 with one or more implantation conditions using an ion implantation tool. The implantation conditions (e.g., ion species, dose, kinetic energy) may be selected to tune the characteristics (e.g., depth profile, amount of damage) of the regions 18, 20. The crystal lattice structure of the semiconductor layer 10 may be damaged within the regions 18, 20, compared to the initial single-crystal state, by the damage induced by the implanted ions. In an embodiment, the ions may be generated from argon or another type of noble atom gas or inert gas. The ion dose is selected to be less than a threshold dose beyond which recrystallization of the damaged semiconductor material in the regions 18, 20 by a subsequent anneal is not possible. In an embodiment, the ion dose may be less than or equal to $1.3 \times 10^{15}$ cm$^{-2}$. In an embodiment, the ion dose may be greater than $1 \times 10^{14}$ cm$^{-2}$. In an embodiment, the ion dose may be within a range of $1 \times 10^{13}$ cm$^{-2}$ to $1 \times 10^{15}$ cm$^2$. In an embodiment, multiple implantations of different kinetic energies and doses may be employed to form the regions 18, 20.

Figure 2:
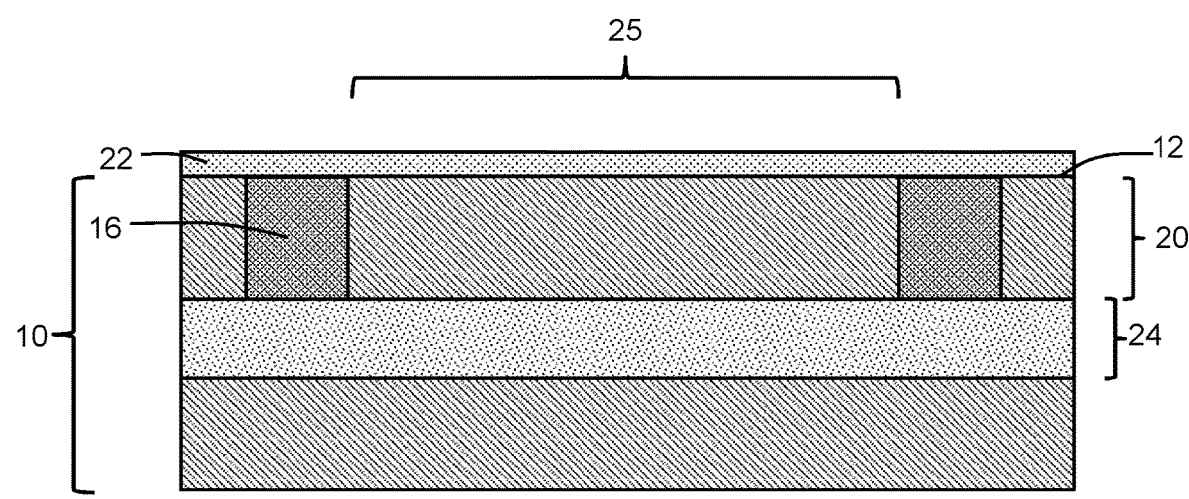

With reference to FIG. 2 in which like reference numerals refer to like features in FIG. 1 and at a subsequent fabrication stage of the processing method, a dielectric layer 22 is formed on the top surface 12 of the semiconductor layer 10 after removing the dielectric layer 14. The dielectric layer 22 may be composed of a dielectric material, such as silicon dioxide deposited by chemical vapor deposition or grown by thermal oxidation.

The semiconductor layer 10 is subjected to a thermal treatment (i.e., annealing process), which subjects the regions 18, 20 of the semiconductor layer 10 to the thermal treatment. In an embodiment, the thermal treatment used to thermally treat the regions 18, 20 of the semiconductor layer 10 may be a spike anneal. In an embodiment, the spike anneal may be a rapid thermal anneal (RTA) performed using, for example, a bank of flash lamps that heat the semiconductor layer 10 to a peak temperature in a range of 860° C. to 1125° C. with a dwell time at the peak temperature of 34 milliseconds to 60 seconds and, in a particular embodiment, the peak temperature may be 1000° C. held for a dwell time of 5 seconds.

The thermal treatment recrystallizes the damaged semiconductor material of the region 18 into a polycrystalline region 24 that contains polycrystalline semiconductor material (e.g., polysilicon), gas atoms, and defects as residual damage in addition to the grains of the polycrystalline semiconductor material. The single-crystal semiconductor material of the semiconductor layer 10, which is arranged below the region 18, provides a crystalline template for recrystallization. The polycrystalline region 24 may be arranged at or near the former location of the peak ion dose and/or peak damage in the semiconductor material of the region 18. The defects may contain trapped atoms of the noble gas or inert gas species (e.g., argon) that were implanted to form the region 18. The polycrystalline region 24 may be lightly doped similar to the original doping of the semiconductor layer 10 and may have a high resistance relative to the remainder of the semiconductor layer 10.

The thermal treatment also recrystallizes the damaged semiconductor material of the region 20 into monocrystalline or single-crystal semiconductor material (e.g., single-crystal silicon). The single-crystal semiconductor material of the region 20 is located between the polycrystalline region 24 and the top surface 12 of the semiconductor layer 10. The presence of the dielectric layer 22 may influence the formation of the single-crystal semiconductor material from the damaged semiconductor material in the region 20 during recrystallization. The region 20 lacks inert gas atoms and defects in contrast to the polycrystalline region 24, and the region 20 after the thermal treatment is in a single-crystal or monocrystalline state in contrast to the polycrystalline state of the polycrystalline region 24.

Figure 3:
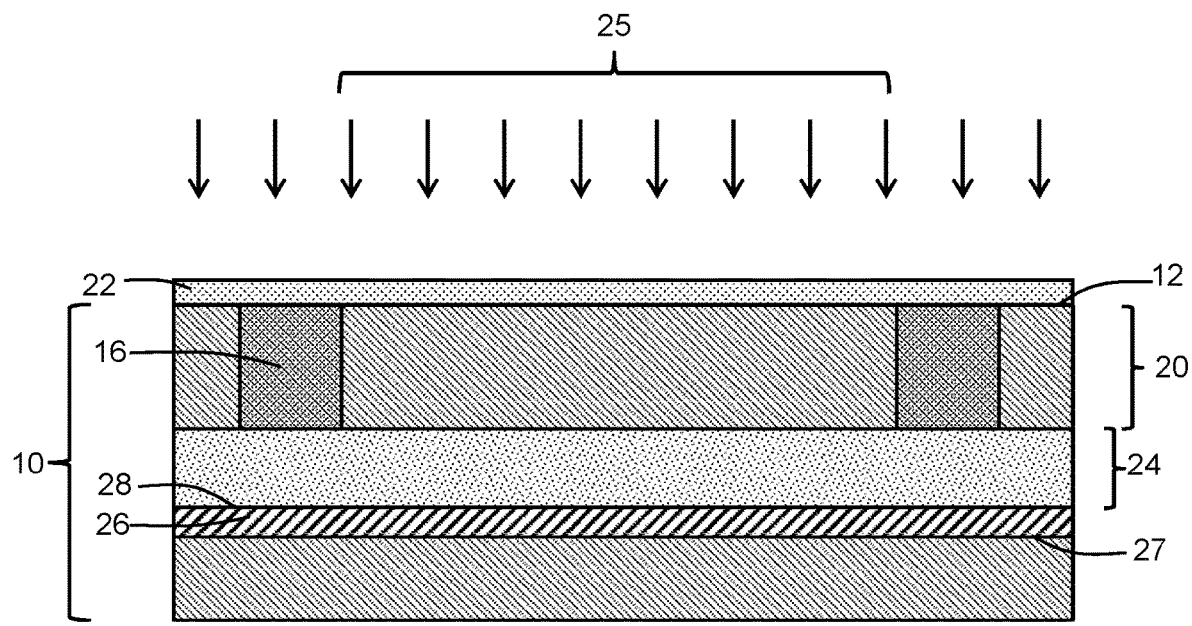

With reference to FIG. 3 in which like reference numerals refer to like features in FIG. 2 and at a subsequent fabrication stage of the processing method, the single-crystal semiconductor material of the region 20, including the active region 25 surrounded by the shallow trench isolation regions 16, may be implanted to form a well. In an embodiment, the region 20 may be implanted with an n-type dopant (e.g., phosphorus and/or arsenic) that provides n-type electrical conductivity. In an alternative embodiment, the region 20 may be implanted with a p-type dopant (e.g., boron) that provides p-type electrical conductivity.

An isolation band 26 is formed by ion implantation in the semiconductor layer 10 and below the region 20 and the well in region 20. In the representative embodiment, the isolation band 26 is located between the polycrystalline region 24 and the portion of the semiconductor layer 10 below the polycrystalline region 24. The isolation band 26 includes dopants of both conductivity types with a net polarity that is opposite to the polarity of the well in region 20. In an embodiment, the net polarity is n-type polarity resulting in semiconductor material in the isolation band 26 that is lightly n-type. The polycrystalline region 24 is arranged between the isolation band 26 and the active region 25 of the semiconductor layer 10.

The isolation band 26 may be formed by implanting the semiconductor layer 10 with ions of an n-type dopant (e.g., phosphorus) that provides n-type electrical conductivity, and also ion implanting the semiconductor layer 10 with a p-type dopant (e.g., boron) that provides p-type electrical conductivity. Each ion implantation introduces energetic ions, as indicated diagrammatically by the single-headed arrows, with ion trajectories that stop over a given depth range in the semiconductor layer 10. For each of the implantations, the ions may be generated from a suitable source gas and implanted into the semiconductor layer 10 with one or more implantation conditions using an ion implantation tool. The implantation conditions (e.g., ion species, dose, kinetic energy) may be selected to tune the characteristics of the isolation band 26, such as its net polarity. The depth ranges of the different implantations overlap such that counter-doping occurs.

In an embodiment, the implantation conditions are chosen such that the concentration of the n-type dopant in the isolation band 26 is greater than the concentration of the p-type dopant in the isolation band 26. The net difference between the p-type and n-type dopant concentrations provides a depleted junction that is lightly-doped n-type. In an embodiment, the difference between the p-type and n-type concentrations may be within a range of about five percent to about fifteen percent. A representative dopant concentration for the lightly-doped semiconductor material in the isolation band 26 may be less than or equal to $10^{16}$ cm$^{-3}$.

The isolation band 26 may extend over a depth range between a lower boundary 27 and an upper boundary 28. In an embodiment, the depth range for the ions of the p-type dopant and the depth range for the ions of the n-type dopant may fully overlap or substantially overlap between the lower and upper boundaries 27, 28. In an embodiment, the depth range for the ions of the p-type dopant and the depth range for the ions of the n-type dopant may fully overlap between the lower and upper boundaries 27, 28. In an embodiment, the depth range for the ions of the p-type dopant and the depth range for the ions of the n-type dopant may substantially overlap between the lower and upper boundaries 27, 28.

The polycrystalline region 24 and the portion of the semiconductor layer 10 below the polycrystalline region 24 adjoin along an interface. In the representative embodiment, the isolation band 26 is located in the portion of the semiconductor layer 10 below the polycrystalline region 24 such that the upper boundary 28 is at the interface. In an alternative embodiment, the isolation band 26 may be fully located in the portion of the semiconductor layer 10 below the polycrystalline region 24 such that the upper boundary 28 is below the interface. In an alternative embodiment, the isolation band 26 may be fully located in the polycrystalline region 24 such that the lower boundary 27 is at or above the interface. In an alternative embodiment, the isolation band 26 may be located partially in the polycrystalline region 24 and partially in the portion of the semiconductor layer 10 below the polycrystalline region 24 such that the isolation band 26 overlaps with the interface.

The isolation band 26 provides a depleted p-n junction. Contingent on the relative concentrations for the n-type and p-type dopants, the p-n junction may be either partially depleted of free mobile charges or fully depleted of free mobile charges. The isolation band 26 supplies a built-in depletion, due to the net difference in dopant concentrations, that does not require biasing to provide isolation of the subsequently formed device structure.

Figure 4:
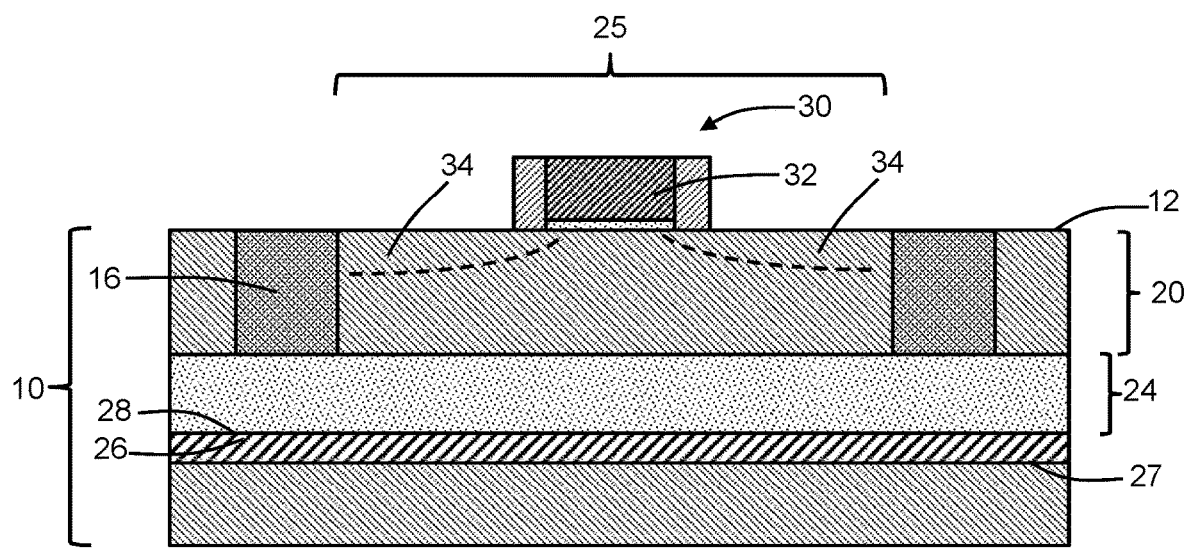

With reference to FIG. 4 in which like reference numerals refer to like features in FIG. 3 and at a subsequent fabrication stage of the processing method, a field-effect transistor 30 may be fabricated by front-end-of-line (FEOL) processing as a device structure in the active region 25 of the semiconductor layer 10. The field-effect transistor 30 may include a gate electrode 32 and a gate dielectric formed by depositing a layer stack and patterning the layer stack with photolithography and etching processes. The gate electrode 32 may be composed of a conductor, such as doped polycrystalline silicon (i.e., polysilicon) or a work function metal, and the gate dielectric may be composed of an electrical insulator, such as silicon dioxide or hafnium oxide. The field-effect transistor 30 may include other elements such as halo regions, lightly doped drain extensions, source/drain regions 34 in the well, and sidewall spacers on the gate electrode 32.

In an embodiment, the field-effect transistor 30 may provide a switch field-effect transistor in a radio-frequency circuit. In alternative embodiments, a different type of device structure may be formed in the active region 25 instead of the field-effect transistor 30.

In an alternative embodiment, the isolation band 26 may be doped by the ion implantations such that the concentration of the p-type dopant is greater than the concentration of the n-type dopant to provide a net polarity that is p-type. In an embodiment, the difference in the p-type and n-type concentrations is within a range of about five percent to about fifteen percent. This modification may be achieved by adjusting the implantation conditions for the successive implants of the ions of the n-type dopant and the ions of the p-type dopant.

Figure 5:
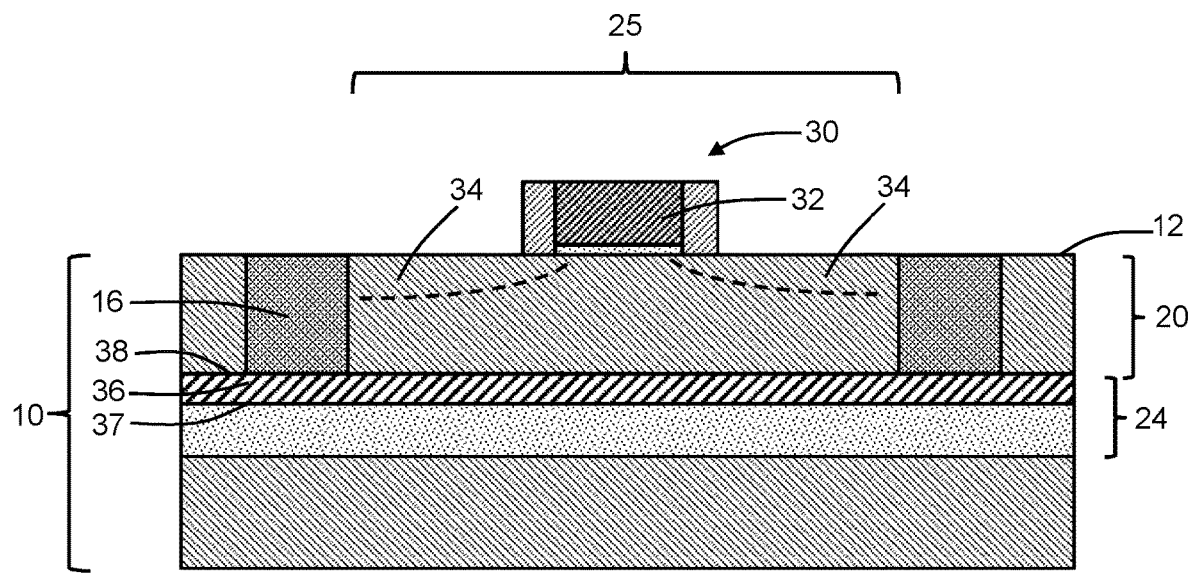
FIGS. 5-6 are cross-sectional views of structures in accordance with alternative embodiments of the invention.

With reference to FIG. 5 in which like reference numerals refer to like features in FIG. 4 and in accordance with alternative embodiments of the invention, an isolation band 36 substantially identical to the isolation band 26 may be positioned in the semiconductor layer 10 below the region 20 and the well in region 20. The region 20 is located between the isolation band 36 and the top surface 12 of the semiconductor layer 10.

The isolation band 36 may extend between a lower boundary 37 and an upper boundary 38 respectively similar to the lower boundary 27 and upper boundary 28 of the isolation band 26. The polycrystalline region 24 and the region 20 of the semiconductor layer 10 adjoin at an interface. In the representative embodiment, the isolation band 36 is located within the polycrystalline region 24 such that the upper boundary 38 coincides with the interface. In an alternative embodiment, the isolation band 36 may be fully located within the polycrystalline region 24 such that the upper boundary 38 is below the interface. In an alternative embodiment, the isolation band 36 may be fully located within the region 20 of the semiconductor layer 10 such that the lower boundary 37 is at or above the interface. In an alternative embodiment, the isolation band 36 may be located partially in the polycrystalline region 24 and partially within the region 20 of the semiconductor layer 10 such that the isolation band 36 overlaps with the interface.

Figure 6:
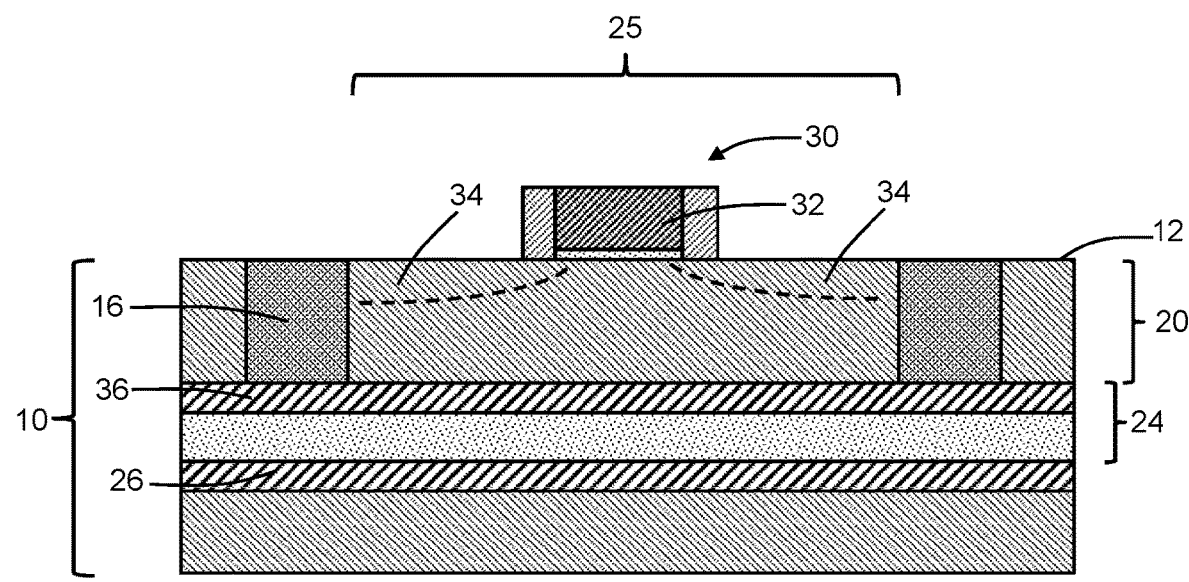

With reference to FIG. 6 in which like reference numerals refer to like features in FIG. 5 and in accordance with alternative embodiments of the invention, both isolation bands 26, 36 may be formed in the semiconductor layer 10 such that the polycrystalline region 24 is positioned between the isolation band 26 and the isolation band 36. The isolation band 36 is located between the isolation band 26 and region 20 and, therefore, is located between the isolation band 26 and the well in region 20.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected"

or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor substrate including a top surface, a first region and a second region each comprised of a single-crystal semiconductor material, and a third region comprised of a polycrystalline semiconductor material, the first region positioned between the top surface and the third region, the second region positioned relative to the top surface below the third region, and the third region separating the first region from the second region;
    a first isolation band in the second region of the semiconductor substrate and below the third region of the semiconductor substrate, the first isolation band comprising a first concentration of a dopant in the second region of the semiconductor substrate; and
    a plurality of shallow trench isolation regions arranged to surround an active region portion of the first region,
    wherein the third region of the semiconductor substrate is arranged between the active region portion and the first isolation band.

2. The structure of claim 1 wherein the first isolation band extends fully beneath an entirety of the active region portion, and the third region of the semiconductor substrate extends fully beneath an entirety of the active region portion.

3. The structure of claim 1 wherein the first isolation band extends beneath the trench isolation regions, and the third region of the semiconductor substrate extends beneath the trench isolation regions.

4. The structure of claim 1 further comprising:
    a field-effect transistor including a first source/drain region in the active region portion and a second source/drain region in the active region portion.

5. The structure of claim 4 wherein the active region portion includes a well doped with a p-type dopant, and the dopant of the first isolation band is an n-type dopant.

6. The structure of claim 4 wherein the active region portion includes a well doped with an n-type dopant, and the dopant of the first isolation band is a p-type dopant.

7. The structure of claim 1 further comprising:
    a second isolation band region between the active region portion and the third region of the semiconductor substrate, the second isolation band comprising a second concentration of the dopant in the first region of the semiconductor substrate.

8. The structure of claim 7 wherein the third region of the semiconductor substrate is positioned between the first isolation band and the second isolation band.

9. The structure of claim 7 wherein the first concentration of the dopant and the second concentration of the dopant are less than or equal to $10^{16}$ cm$^{-3}$.

10. The structure of claim 1 wherein the first isolation band contains a concentration of the dopant that is less than or equal to $10^{16}$ cm$^{-3}$.

11. The structure of claim 1 wherein the polycrystalline semiconductor material of the third region of the semiconductor substrate comprises noble gas atoms.

12. The structure of claim 11 wherein the noble gas atoms are argon atoms.

13. A structure comprising:
    a semiconductor substrate including a top surface, a first region and a second region each comprised of a single-crystal semiconductor material, and a third region comprised of a polycrystalline semiconductor material, the first region positioned between the top surface and the third region, the second region positioned relative to the top surface below the third region, and the third region separating the first region from the second region;
    an isolation band in the first region of the semiconductor substrate and above the third region of the semiconductor substrate, the isolation band comprising a first concentration of a dopant in the first region of the semiconductor substrate; and
    a plurality of shallow trench isolation regions arranged to surround an active region portion of the first region,
    wherein the isolation band is arranged between the active region portion and the third region of the semiconductor substrate.

14. The structure of claim 13 wherein the isolation band extends fully beneath an entirety of the active region portion, and the third region of the semiconductor substrate extends fully beneath an entirety of the active region portion.

15. The structure of claim 13 wherein the isolation band extends beneath the trench isolation regions, and the third region of the semiconductor substrate extends beneath the trench isolation regions.

16. The structure of claim 13 further comprising:
    a field-effect transistor including a first source/drain region in the active region portion and a second source/drain region in the active region portion.

17. The structure of claim 13 wherein the isolation band contains a concentration of the dopant that is less than or equal to $10^{16}$ cm$^{-3}$.

18. The structure of claim 13 wherein the polycrystalline semiconductor material of the third region of the semiconductor substrate comprises noble gas atoms.

19. The structure of claim 18 wherein the noble gas atoms are argon atoms.

* * * * *